US006505333B1

(12) United States Patent
Tanaka

(10) Patent No.: US 6,505,333 B1
(45) Date of Patent: Jan. 7, 2003

(54) AUTOMATIC PLACEMENT AND ROUTING OF SEMICONDUCTOR INTEGRATED CIRCUITS

(75) Inventor: Genichi Tanaka, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 79 days.

(21) Appl. No.: 09/649,203

(22) Filed: Aug. 28, 2000

(30) Foreign Application Priority Data

Mar. 28, 2000 (JP) ........................................ 2000-089334

(51) Int. Cl.[7] ............................................... G06F 17/50
(52) U.S. Cl. .......................................... 716/13; 716/12
(58) Field of Search ........................................ 716/1–14

(56) References Cited

U.S. PATENT DOCUMENTS 5,793,643 A * 8/1998 Cai ............................. 716/12
6,037,547 A * 3/2000 Blish, II ..................... 174/264

FOREIGN PATENT DOCUMENTS

| JP | 5-67175 | 3/1993 |
| JP | 6-45442 | 2/1994 |
| JP | 10270563 A | * 10/1998 |

OTHER PUBLICATIONS

U.S. patent application Ser. No. 09/048,587, Hiraga, filed Aug. 2001.*

* cited by examiner

*Primary Examiner*—Vuthe Siek
*Assistant Examiner*—Sun James Lin
(74) *Attorney, Agent, or Firm*—Burns, Doane, Swecker & Mathis, LLP

(57) ABSTRACT

There is provided a method of automatic placement and routing of a semiconductor integrated circuit with a global routing step which comprises the steps of, based on design information completed to a placement step, determining a wiring route considering a shape of a via and/or the number of the via, estimating the number of routing tracks to be used in each search of the global routing step, and verifying the estimated result, thereby obtaining a layout according to a wiring estimate at the global routing step.

6 Claims, 4 Drawing Sheets

AUTOMATIC PLACEMENT AND ROUTING OF SEMICONDUCTOR INTEGRATED CIRCUITS

BACKGROUND OF THE INVENTION

1. Field of the Invention

The present invention relates to a method of automatic placement and routing of a semiconductor integrated circuit in semiconductor circuit design.

2. Description of the Prior Art

FIG. 6A is a wiring diagram showing a result of a global routing step according to a conventional method of automatic placement and routing of a semiconductor integrated circuit, and FIG. 6B illustrates a shape of a via or via shape. In the drawings, the reference numeral 601–606 are resultant wirings of the global routing step; 601, 602, and 604 designate a first wiring on a layer A; 603, 605, and 606 designate a second wiring on a layer B; and 607 designates a via connecting the first wiring 604 to the second wiring 603. In addition, the reference numeral 608 designates a via shape with a cross-form pattern; 609 designates a vertical routing track; and 610 designates a horizontal routing track. The via shape 608 is prepared previously as a library with other functional blocks such as gate and flip-flop prior to the global routing step. Note that in FIG. 6A, a search unit is provided with a small area of 5 tracks×5 tracks.

A layout for the above semiconductor integrated circuit is to produce an artwork data as to wirings of the whole chip when a logic circuit diagram described with the functional block prepared in the library and a formation of a semiconductor chip are provided. Nowadays, there is proposed an automatic layout system which enables the production of the artwork data without errors for a short time period and which is put into practice.

In order to simplify general layout problems in accordance with a larger scale of circuits to be targeted, the automatic layout system (not depicted) deals with an automatic placement and routing flow which are divided into three steps of a placement step, a global routing step, and a detailed routing step, and processed in this turn.

The operation will be next described, referring to a flow chart in a global routing step of FIG. 8.

Prior to an implementation of the global routing step, a technology file is first produced, and a library including layout patterns is produced in a placement step. From the library, a reading of logic connection information such as gate circuit and flip-flop is carried out, and a placement of functional blocks is carried out on a semiconductor chip based on that information, a placement result including design information upon completion of the placement is filed previously in a database and the like Then, based on the filed placement result (ST501), a global wiring route is determined (ST502), and the number of wirings to be used is made an estimate in each search unit (ST503). Herein, the via shape is not considered yet. In addition, the step ST502 and the step ST503 serve as a global routing function together, and are carried out simultaneously or in turn. Finally, the resultant wirings are verified whether to be possible (ST504).

Here, when it is determined as "wiring possible", a set of flow of the global routing step is brought to an end, while when it is determined as "wiring impossible", the steps ST502 an ST503 are carried out again. In the second or later steps ST502 and ST503, an improvement is carried out based on the repetitive results at the global routing step. Incidentally, in the steps ST504, the global routing step may be brought to an end by other conditions such as practice time.

However, in the prior art, since the via shape and/or the number of via holes were not considered at the global routing step, in a result of the subsequent detailed routing step, as shown in FIG. 7, the first wiring 602 and the second wiring 605 to be passed on wire grids determined as "unusable" (see wire grids 107, 108 and the like described later) failed to be wired due to the placement of the via 607.

Since the conventional method of automatic placement and routing of a semiconductor integrated circuit is configured as described above, in the automatic placement and routing, the via shape was not considered at the global routing step making an estimate of wirings. For this reason, at the detailed routing step of carrying out actually a layout, when a via is, allocated with a large-sized one, a "wiring impossible" state such that its neighboring routing tracks become unusable may be occurred, or a layout quite different from the estimated wiring route determined at the global routing step may be completed.

In the case of such a "wiring impossible" state, a LSI cannot operate, and in the case of the wrong wiring route, the control of timings and the like may be difficult.

SUMMARY OF THE INVENTION

The present invention is made to solve such a problem, and it is an object to provide a method of automatic placement and routing of a semiconductor integrated circuit capable of making an estimate of wiring routes with good precision while a high-speed process on wiring estimates is maintained.

According to a first aspect of the present invention, there is provided a method of automatic placement and routing of a semiconductor integrated circuit with a global routing step, said step comprising: a first step of, based on a placement result in which a functional block included in a library is placed on a semiconductor chip, determining a global wiring route by considering a shape of a via in a connecting point between layers and then considering a wire grid to be unusable by an allocation of the via; a second step of counting the number of routing tracks to be used in each certain search unit; and a third step of determining a wiring actually whether to be possible by verifying a determined result of the global wiring route at the first step and a counted result of the routing tracks to be used at the second step.

According to a second aspect of the present invention, there is provided a method of automatic placement and routing of a semiconductor integrated circuit with a global routing step, said step comprising: a first step of, based on a placement result in which a functional block included in a library is placed on a semiconductor chip, determining a global wiring route by considering the number of a plurality of via allocations in a connecting point between layers and then considering a wire grid to be unusable by the via allocations; a second step of counting the number of routing tracks to be used in each certain search unit; and a third step of determining a wiring actually whether to be possible by verifying a determined result of the global wiring route at the first step and a counted result of the routing tracks to be used at the second step.

According to a third aspect of the present invention, there is provided a method of automatic placement and routing of a semiconductor integrated circuit with a global routing step, said step comprising: a first step of, based on a placement result in which a functional block included in a library is placed on a semiconductor chip, determining a global wiring route by considering a shape of a via in a connecting point between layers and then considering a wire grid to be unusable by an allocation of the via; a second step of counting the number of routing tracks to be used in each certain search unit by considering the shape of the via and then considering a wire grid to be unusable by an allocation of the via; and a third step of determining a wiring actually whether to be possible by verifying a determined result of the global wiring route at the first step and a counted result of the routing tracks to be used at the second step.

According to a fourth aspect of the present invention, there is provided a method of automatic placement and routing of a semiconductor integrated circuit with a global routing step, said step comprising: a first step of, based on a placement result in which a functional block included in a library is placed on a semiconductor chip, determining a global wiring route by considering the number of a plurality of via allocations in a connecting point between layers and then considering a wire grid to be unusable by the via allocations; a second step of counting the number of routing tracks to be used in each certain search unit by considering the number of the plurality of via allocations and then considering a wire grid to be unusable by the via allocations; and a third step of determining a wiring whether to be possible by verifying a determined result of the global wiring route at the first step and a counted result of the routing tracks at the second step.

Here, the second step may assume a plurality of via allocations or count the number of routing tracks to be used by considering a possibility of occurrences of the via allocations.

DETAILED DESCRIPTION OF THE PREFERRED EMBODIMENTS

An embodiment of the present invention will be described below.

Embodiment 1

Figure 1A:
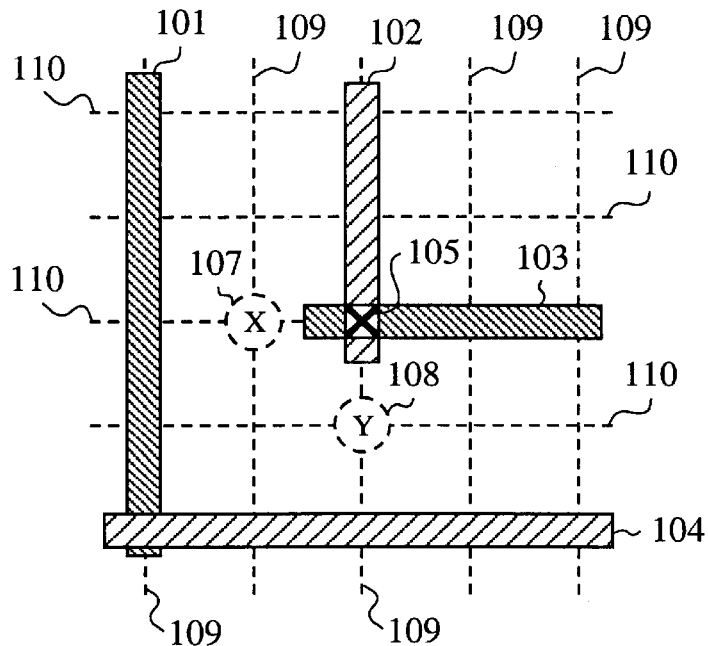
FIG. 1A is a wire diagram showing a global routing result of a method of automatic placement and routing of a semiconductor integrated circuit according to an embodiment 1 of the present invention.
Figure 1B:
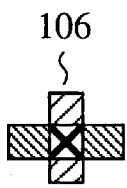
FIG. 1B illustrates a via shape.

FIG. 1A is a wire diagram showing a global routing result of a method of automatic placement and routing of a semiconductor integrated circuit according to an embodiment 1 of the present invention, and FIG. 1B illustrates a shape of a via or a via shape. In the drawings, the reference numerals 101–104 are resultant wirings from a global routing result; 101 and 103 designate a first wiring on a layer A; 102 and 104 designate a second wiring on a layer B; 105 designates a via as a connecting point between the layer A and the layer B which connects the second wiring 102 and the first wiring 103; 106 designates a via shape with a cross-form pattern; 107 and 108 each designate a wire grid; 109 designates a vertical routing track; and 110 designates a horizontal routing track. Prior to the global routing step, the via shape 106 is prepared previously as a library with other functional blocks such as gate and flip-flop. Note that in FIG. 1A, a search unit is provided with a small area of 5 tracks×5 tracks.

In the embodiment 1, the via shape is considered at a global routing function, and it is considered that a routing track adjacent to an allocated via is unusable on a design rule. That is, when the via 105 is allocated, there is provided information that when a routing track adjacent to the via 105 cannot be wired, this track is unusable for writing, thus determining a global wiring route.

According to FIG. 1, X and Y each denotes a wire grid determined as "unusable" a via allocating direction is assumed, and correspond to the wire grids 107 and 108. The wire grid X designates "unusable layer A" for the first wirings 101 and 103, while the wire grid y designates "unusable layer B" for the second wirings 102 and 104.

An automatic layout system (not depicted) employed for the automatic placement and routing method typically divides it into a placement step, a global routing step, and a detailed routing step, and cope with an automatic placement and routing flow in this turn.

Figure 2:
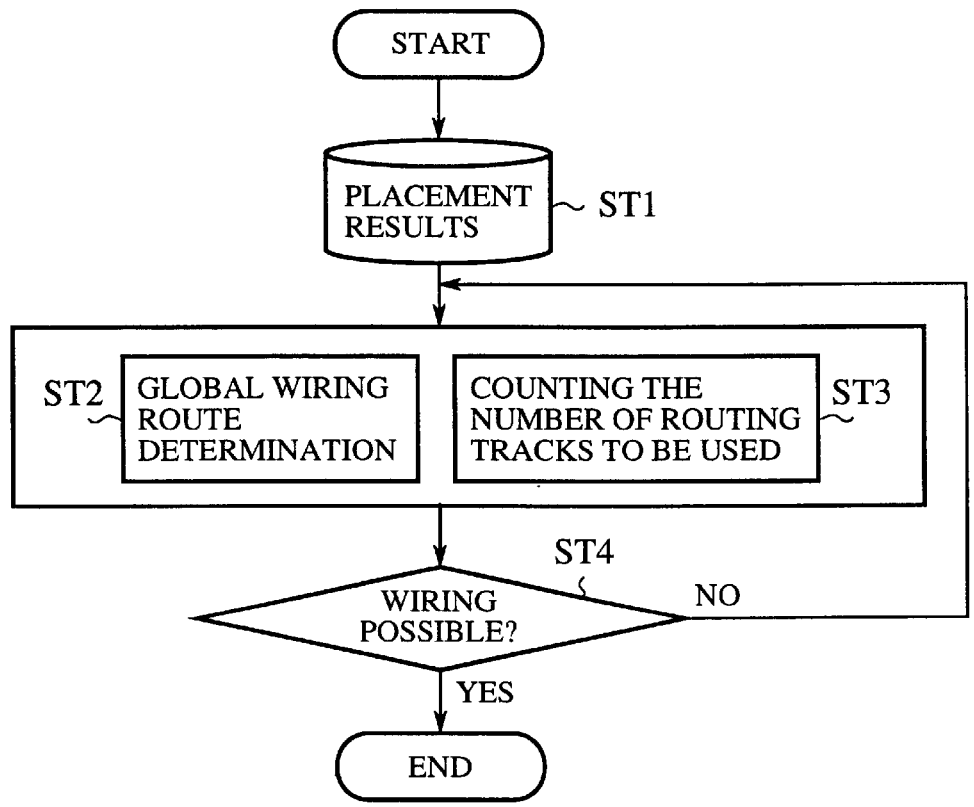
FIG. 2 is a flow chart at a global routing step according to the method of automatic placement and routing of a semiconductor integrated circuit of FIG. 1.

The operation will be next described, referring to the flow chart in a global routing step of FIG. 2.

Prior to an implementation of the global routing step, a technology file is first produced, and a library including layout patterns and the like is produced in the placement step. A reading of loc connection information such as gate circuit and flip-flop is carried out from this library, and a placement of functional blocks is carried out on a semiconductor chip based on that information, a placement result including design information upon completion of the placement is filed previously in a database and the like.

Then, based on the filed placement result (ST1), considering the via shape, a global wiring route is determined (ST2), and the number of routing tracks to be used is counted in each certain search unit and then the number of wirings to be used is made an estimate (ST3). In addition, the step ST2 and the step ST3 serve as a global routing function, and are carried out simultaneously or in turn. Finally, the resultant wirings are verified whether to be possible (ST4).

Here, when it is determined as "wiring possible", a set of flow of the global routing step is brought to an end, while when it is determined as "wiring impossible", the steps ST2 and ST3 are carried out again. In the second or later steps ST2 and ST3, an improvement is carried out based on the repetitive results at the global routing step. Incidentally, in the step ST4, the global routing step may be completed by other conditions such as practice time.

As the above-mentioned global routing function will be described more specifically, when the via 105 is allocated, the via shape 106 is considered. Thus, in the case where the wiring cannot be allocated to a routing track adjacent to the via 105, a global wiring route is determined by providing information of "unusable" to the neighboring routing track. Namely, in FIG. 1A, since there exist wire grids X, Y determined as "unusable", the global routing function assigns the first wiring 101 to the vertical routing track 109 on the left side by one track of the wire grid X, and also assigns the second wiring 104 to the horizontal routing track 110 on the lower side by one track of the wire grid Y. With this manner, even on actual layouts, the wirings may be implemented according to the estimate at the global routing step.

As described above, according to the embodiment 1, since the shape of a via is considered in the step ST2, and a global wiring route is determined by providing information in which a routing track adjacent to the via cannot be wired when the via is allocated, a wire grid not to be wired on an actual layout may be removed at this stage. With this manner, the layout determined as "wiring possible" at the global routing step may be implemented at the detailed routing step as well.

Therefore, while a high speed performance is maintained during the routing estimate, a wiring route may be estimated with good precision. In addition, estimates of timing, consumed power, and the like also may be controlled precisely due to the high estimate precision of the wiring route.

Embodiment 2

Figure 3:
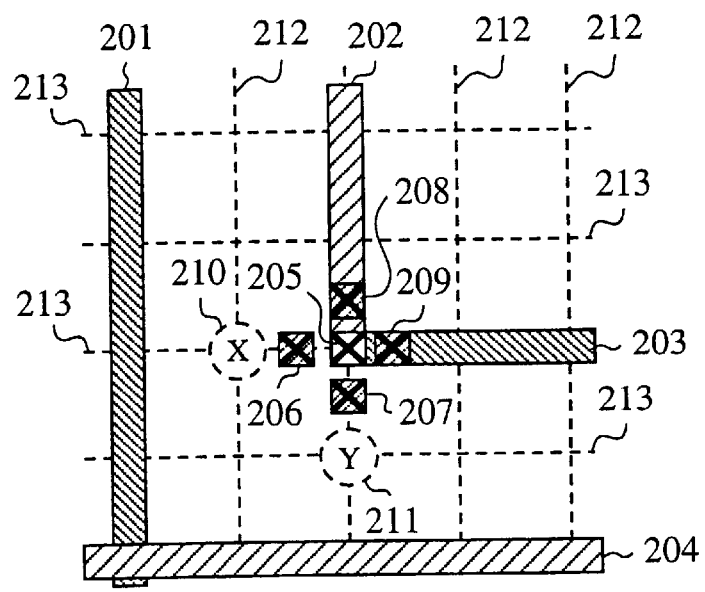
FIG. 3 is a flow chart showing a global routing result of a method of automatic placement and routing of a semiconductor integrated circuit according to an embodiment 2 of the present invention.

FIG. 3 is a wire diagram showing a global routing result of a method of automatic placement and routing of a semiconductor integrated circuit according to an embodiment 2 of the present invention. In the drawing, the reference numerals 201–204 are resultant wirings through a global routing step; 201 and 203 each designate a first wiring on a layer A; 202 and 204 each designate a second wiring on a layer B; 205 designates a via as a connecting point between the layer A and the layer B which connects the second wiring 202 and the first wiring 203; 206–209 each designate a via allocable position; 210 and 211 each designate a wire grid; 212 designates a vertical routing track; and 213 designates a horizontal routing track. In addition, X and Y each denote a wire grid determined as unusable when a via allocating direction is assumed. Here, the via allocable positions 206–209 are positioned adjacently on the left, lower, upper and right sides of the via 205, respectively, as the connecting points between the layers and located between the wire grids.

In the embodiment 2, it is considered that a plurality of vias are allocated on a global routing function, and that a routing track adjacent to the via allocated becomes unusable on design rules. That is, when on plural allocations of the vias the neighboring routing track cannot be routed, there is provided with information that the routing track is unusable, thus determining a global wiring route. In this case, since there exist the allocations permitting the plurality of vias, employed is a plurality of use prohibition information which only one routing track is not available.

The operation will be next described, referring to the flow chart in the global routing step of FIG. 2.

Prior to an implementation of the global routing step, a technology file is first produced, and a library including layout patterns and the like is produced in the placement step. A reading of logic connection information such as gate circuit and flip-flop is carried out, and a placement of functional blocks is carried out on a semiconductor chip based on that information, a placement result including design information upon completion of the placement is filed previously in a database and the like.

Then, based on the filed placement result (ST1), considering the number of the via allocations around the via 205 as a connecting point between the layers, and considering a plurality of the neighboring via allocations, a global wiring route is determined (ST2), and the number of routing tracks to be used is counted in each certain search unit and the number of wirings to be used is made an estimate (ST3). In addition, the step ST2 and the step ST3 serve as a global routing function, and are carried out simultaneously or in turn. Finally, the resultant wirings are verified whether to be possible (ST4).

Here, when it is determined as "wiring possible", a set of flow of the global routing step is brought to an end, while when it is determined as "wiring impossible", the steps ST2 and ST3 are carried out again. In the second or later steps ST2 and ST3, an improvement is carried out based on the repetitive results at the global routing step. Incidentally, in the step ST4, the global routing step may be completed by other conditions such as practice time.

As the above-mentioned global routing function will be described more specifically, for example, assuming that two vias are allocated when the via 205 is allocated, when the assumed via allocation other than the via 205 is assumed as the via allocable position 206 among the four, via allocable positions 206, 207, 208, and 209, the wire grid 210 becomes unusable. On the other hand, when the via allocable position 207 is assumed, the wire grid 211 becomes unusable. Due to presence of the wire grid 210 or 211, in the global routing step, the first wiring 201 is allocated to a vertical routing track on the left side by one track, while the second wiring 204 is allocated to a horizontal routing track on the lower side by one track.

In the actual global routing step, when two vias are allocated, the via allocation is positioned at one place other than the via 205. Only when the via allocable position 206 is assumed, the first wiring 201 is estimated on a track spaced by one track from the track adjacent to the via 205. Similarly, only when the via allocable position 207 is assumed, the second wiring 204 is estimated on a track spaced by one track from the track adjacent to the via 205. FIG. 3 illustrates conveniently that the first wirings 201 and 204 each is routed at a separate position. With this manner, on actual layouts, the wirings may be implemented according to the estimate at the global routing step.

As described above, according to the embodiment 2, since a plurality of via allocations are considered or assumed upon the determination of a global wiring route at the step ST2, a wire grid which cannot be wired on actual layouts may be removed at this stage. With this manner, the layout determined as "wiring possible" at the global routing step may be implemented at the detailed routing step as well.

Therefore, while a high speed performance is maintained during the routing estimate, a wiring route may be estimated with good precision. In addition, estimates of timing, consumed power, and the like also may be controlled precisely due to the high estimate precision of the wiring route.

Embodiment 3

Figure 4A:
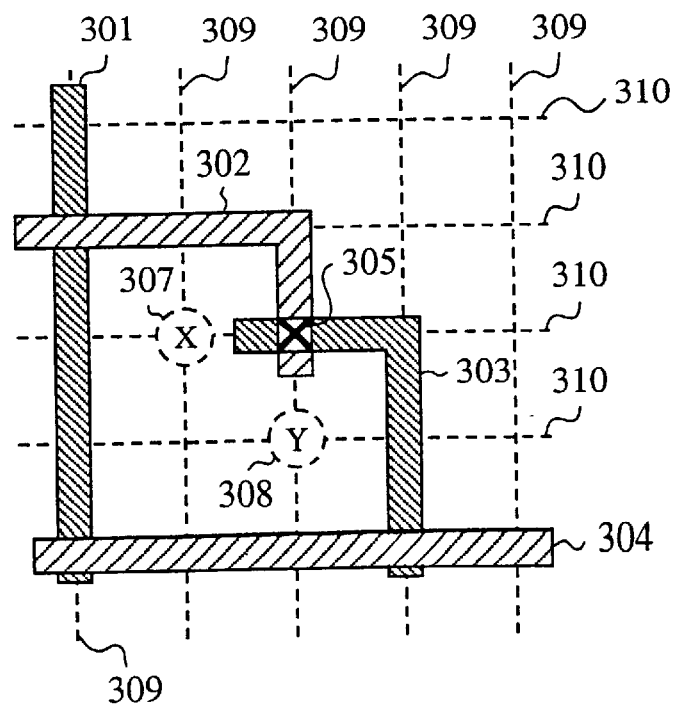
FIG. 4 is a flow chart showing a global routing result of a method of automatic placement and routing of a semiconductor integrated circuit according to an embodiment 3 of the present invention.
Figure 4B:
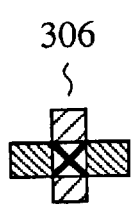

FIG. 4A is a wire diagram showing a global routing result of a method of automatic placement and routing os a semiconductor integrated circuit according to an embodiment 3 of the present invention, and FIG. 4B illustrates a shape of a via or via shape.

In the drawings, the reference numerals 301–304 are resultant wirings through a global routing step; 301 and 303 each designates a first wiring on a layer A; 302 and 304 each designates a second wiring on a layer B; 305 designates a via which connects the second wiring 302 and the first wiring 303; 306 designates a via shape with a cross-form pattern; 307 and 308 each designates a wire grid; 309 designates a vertical routing track; and 310 designates a horizontal routing track.

In addition, X and Y each denote a wire grid determined as unusable when a via allocating direction is assumed, and correspond to the wire grids 307 and 308. The wire grid X designates "unusable layer A" for the first wirings 301 and 303, while the wire grid Y designates "unusable layer B" for the second wirings 302 and 304.

In the embodiment 3, the via shape is considered at a global routing function, and it is considered that a routing track adjacent to an allocated via is unusable on a design rule. That is, when the number of estimated wirings every layer is counted in each certain search unit at the global routing, the shape of a via is considered, and when a wiring layer is changed by using a via which cannot use its adjacent track, the number of wirings to be used is increased by the number of "wiring impossible" tracks.

The operation will be next described, referring to the flow chart in the global routing step of FIG. 2.

Prior to an implementation of the global routing step, a technology file is first produced, and a library including layout patterns and the like is produced in the placement step. A reading of logic connection information such as gate circuit and flip-flop is carried out, and a placement of functional blocks is carried out on a semiconductor chip based on that information, a placement result including design information upon completion of the placement is filed previously in a database and the like.

Then, based on the filed placement result (ST1), considering a via shape, a global wiring route is determined (ST2), and the number of wirings to be used is counted and the number of wirings to be used is made an estimate in each certain search unit (ST3). In addition, the step ST2 and the step ST3 serve as a global routing function, and are carried out simultaneously or in turn. Finally, the resultant wirings are verified whether to be possible (ST4).

Here, when it is determined as "wiring possible", a set of flow of the global routing step is brought to an end, while when it is determined as "wiring impossible", the steps ST2 an ST3 are carried out again. In the second or later steps ST2 and ST3, an improvement is carried out based on the repetitive results at the global routing step. Incidentally, in the step ST4, the global routing step may be completed by other conditions such as practice time.

As the above-mentioned global routing function will be described more specifically, estimates of available routing tracks and the number of wirings to be used are counted by use of a search unit of a small area of 5 tracks×5 tracks, as shown in FIG. 4A. In this case, as described above, considering "wiring impossible" point for use according to the via shape with the cross-form pattern, the following estimates are made: 4 tracks on the layer A and 5 tracks on the layer B in the vertical direction; and 5 tracks on the layer A and 4 tracks on the layer B in the horizontal direction.

Figure 6A:
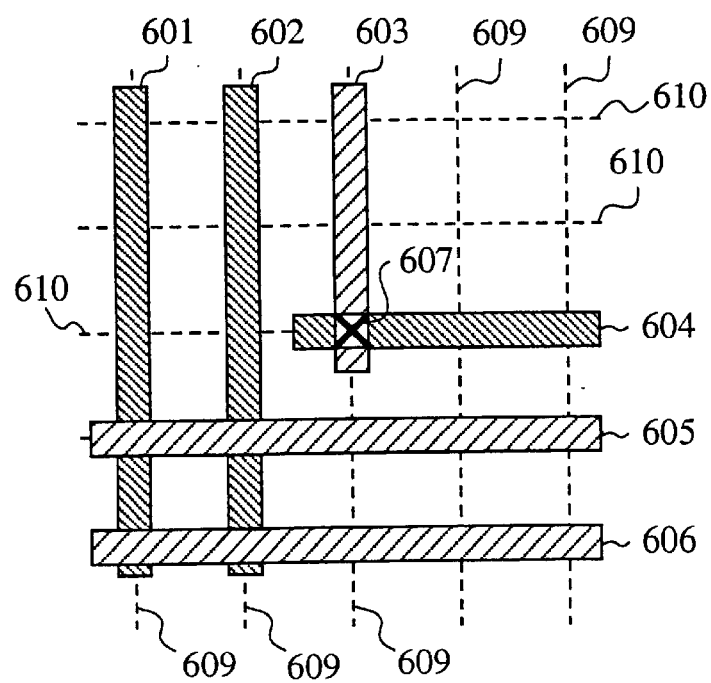
FIG. 6A is a wire diagram showing a global routing result in a conventional method of automatic placement and routing of a semiconductor integrated circuit.
Figure 6B:
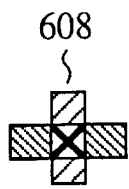
FIG. 6B illustrates a via shape.
Figure 7:
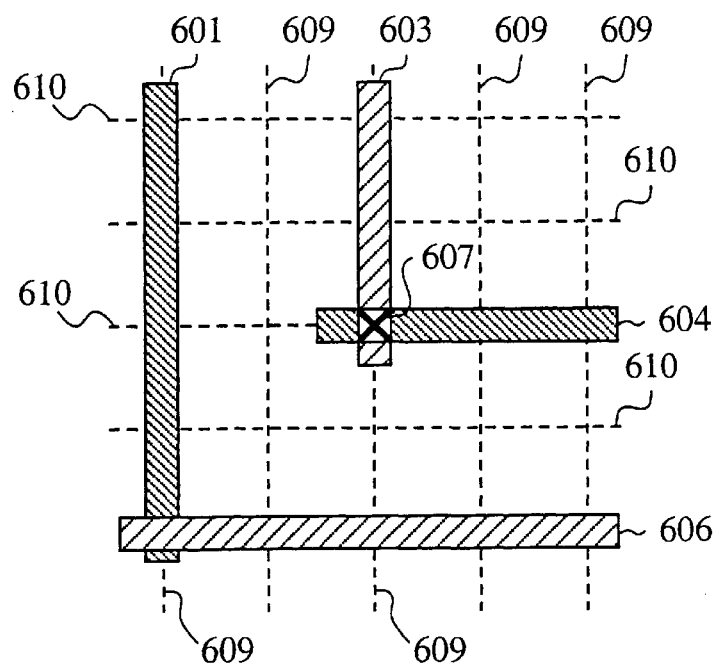
FIG. 7 is a wire diagram showing a detailed routing result in a conventional method of automatic placement and routing of a semiconductor integrated circuit.
Figure 8:
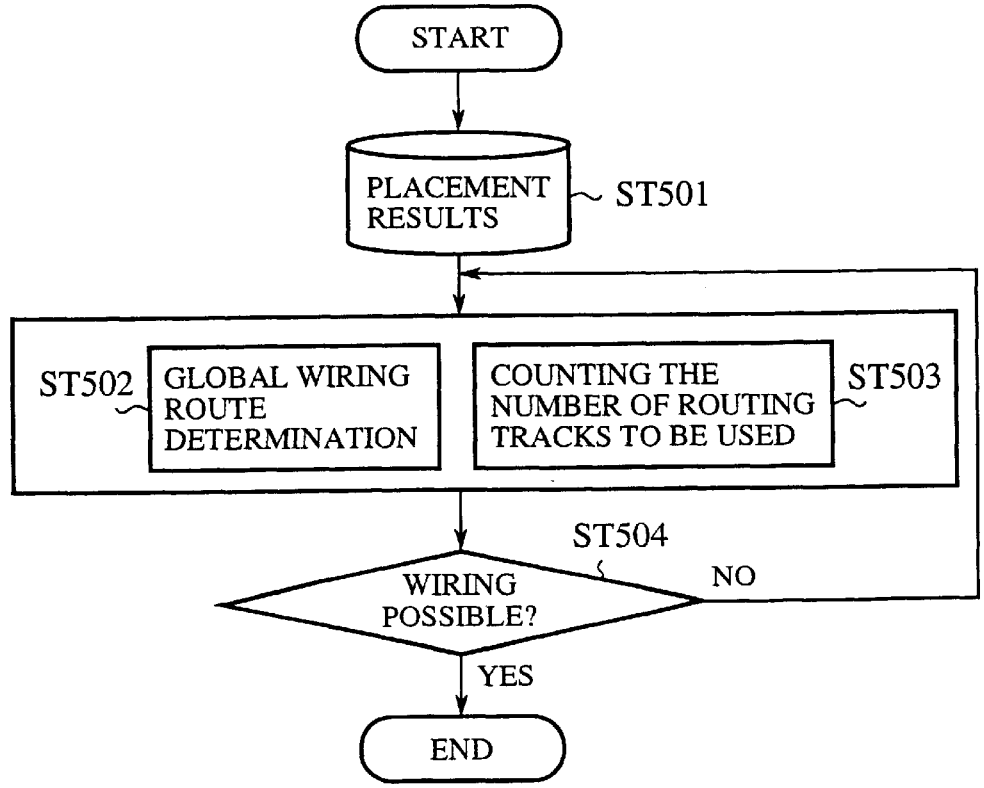
FIG. 8 is a flow chart showing a global routing result of a conventional method of automatic placement and routing of a semiconductor integrated circuit.

On the other hand, not considering the "wiring impossible" points for use as the prior art, the following estimates are made: 3 tracks on the layer A and 5 tracks on the layer B in the vertical direction; and 5 tracks on the layer A and 3 tracks on the layer B in the horizontal direction. In this case, after completion of the detailed routing step, there occurs a "wiring impossible" state or a layout quite different from an estimated wiring route (see FIGS. 6 and 7).

Therefore, considering the "wiring impossible" points for use according to the via shape, wirings according to an estimate at the global routing step may be implemented upon an actual layout as well.

As described above, according to the embodiment 3, in the global routing function, since the number of routing tracks to be used is counted, considering a shape of a via and considering "wiring impossible" points for use because of a via allocation, a layout determined as "wiring possible" at the global routing step may be implemented also at the detailed routing step.

Therefore, while a high speed performance is maintained during a wiring estimate, a wiring route may be estimated with good precision. In addition, estimates of timing, consumed power, and the like also may be controlled precisely due to the high estimate precision of the wiring route.

Embodiment 4

Figure 5:
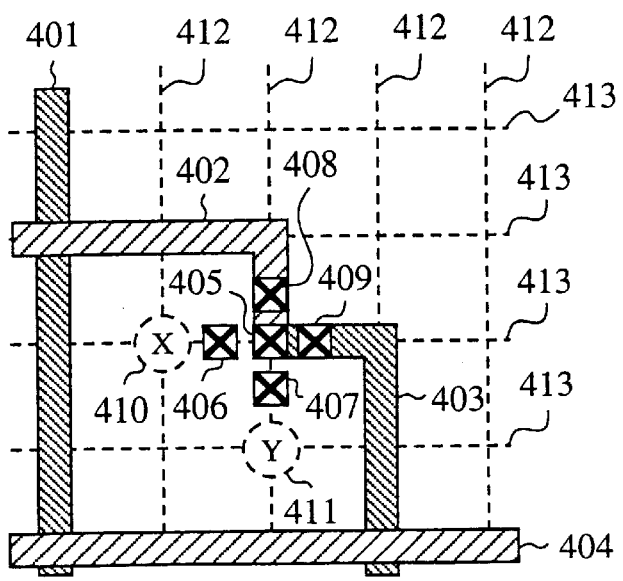
FIG. 5 is a flow chart showing a global routing result of a method of automatic placement and routing of a semiconductor integrated circuit according to an embodiment 4 of the present invention.

FIG. 5 is a wire diagram showing a global routing result of a method of automatic placement and routing of a semiconductor integrated circuit according to an embodiment 4 of the present invention.

In the drawing, the reference numerals 401–404 are resultant wirings through a global routing step; 401 and 403 each designate a first wiring on a layer A; 402 and 404 each designates a second wiring on a layer B; 405 designates a via as a connecting point between the layer A and the layer B which connects the second wiring 402 and the first wiring 403; 406–409 each designates a via allocable position; 410 and 411 each designates a wire grid; 412 designates a vertical routing track; and 413 designates a horizontal routing track. In addition, X and Y each denotes a wire grid determined as "unusable" when a via allocating direction is assumed, corresponding to the wire grids 410 and 411, respectively.

In the embodiment 4, it is considered that a plurality of vias are allocated on a global routing function, and that a routing track adjacent to the via allocated becomes unusable on design rules. That is, when the number of estimated wirings every layer is counted for each certain search unit at the global routing, a possibility of allocations which may be allocated by a plurality of vias is considered. When a wiring layer is changed by use of a via in which the neighboring track becomes unusable, the number of wirings to be used is increased by the number of "wiring impossible" tracks.

The operation will be next described, referring to the flow chart in the global routing step of FIG. 2.

Prior to an implementation of the global routing step, a technology file is first produced, and a library including layout patterns and the like is produced in the placement step. A reading of logic connection information such as gate circuit and flip-flop is carried out, and thus a placement of functional blocks is carried out on a semiconductor chip based on that information, a placement result including design information upon completion of the placement is filed previously in a database and the like Then, based on the filed placement result (ST1), considering allocations of the plurality of vias, a global wiring route is determined (ST2), and considering the allocations of the plurality of vias as well, the number of routing tracks to be used is counted and the number of wirings to be used is made an estimate in each certain search unit (ST3). In addition, the step ST2 and the step ST3 serve as a global routing function, and are carried out simultaneously or in turn. Finally, the resultant wirings are verified whether to be possible (ST4).

Here, when it is determined as "wiring possible", a set of flow of the global routing step is brought to an end, while when it is determined as "wiring impossible", the steps ST2 and ST3 are carried out again. In the second or later steps ST2 and ST3, an improvement is carried out based on the repetitive results at the global routing step. Incidentally, in the step ST4, the global routing step may be completed by other conditions such as practice time.

As the above-mentioned global routing function will be described more specifically, the allocations of two vias are assumed. As the four via allocable positions 406–409 are provided as described above, when the via allocable position 406 among the four is assumed, the wire grid 410 becomes unusable, while when the via allocable position 407 among the four is assumed, the wire grid 411 becomes unusable.

Further, in the step ST3, estimates of the number of available routing tracks and the number of wirings to be used are counted in certain search unit. On this occasion, considering "wiring impossible" points for use due to a via, as a result, assuming that the via is put at the via allocable position 406, an estimate is made as follows: 4 tracks on the layer A and 5 tracks on the layer B pass in the vertical direction, and 5 tracks on the layer A and 3 tracks on the layer B pass in the horizontal direction. On the other hand, not considering "wiring impossible" points for sue due to a via, an estimate is made as follows: 3 tracks on the layer A and 5 tracks on the layer B pass in the vertical direction, and 5 tracks on the layer A and 3 tracks on the layer B pass in the horizontal direction.

In addition, the via allocation is not assumed on counting of the tracks, but a possibility of a via occurrence may be considered. In the above case, assuming that the via occurrence is a possibility of one-fourth for each of the via allocable positions 406–409, an estimate is made as follows: 3.5 tracks on the layer A and 5 tracks on the layer B pass in the vertical direction, and 5 tracks on the layer A and 3.5 tracks on the layer B pass in the horizontal direction.

In the embodiments 1–4, though the search unit of the global routing step is set to 5 tracks×5 tracks conveniently, there are many cases resulting in a several tens tracks scale. Note that since in the global routing step, the number of estimated wirings to be used is determined as large or small with respect to the number of available tracks, there is no difficulty for decimal occurrences.

As described above, a wiring according to an estimate at the global routing may be implemented even on an actual layout.

What is claimed is:

1. A method of automatic placement and routing of a semiconductor integrated circuit with a global routing step, said step comprising:

a first step of, based on a placement result in which a functional block included in a library is placed on a semiconductor chip design, determining a global wiring route by considering a shape of a via in a connecting point between layers and then considering whether a wire grid would be unusable by an allocation of said via;

a second step of counting the number of routing tracks to be used in each certain search unit; and a third step of determining whether a wiring is possible by verifying a determined result of said global wiring route at said first step and a counted result of said routing tracks to be used at said second step.

2. A method of automatic placement and routing of a semiconductor integrated circuit with a global routing step, said step comprising:

a first step of, based on a placement result in which a functional block included in a library is placed on a semiconductor chip design, determining a global wiring route by considering the number of a plurality of via allocations connecting points between layers and then considering whether a wire grid is unusable by said via allocations;

a second step of counting the number of routing tracks to be used in each certain search unit; and a third step of determining a wiring actually whether to be possible be verifying a determined result of said global wiring route at said first step and a counted result of said routing tracks to be used at said second step.

3. A method of automatic placement and routing of a semiconductor integrated circuit with a global routing step, said step comprising:

a first step of, based on a placement result in which a functional block included in a library is placed on a semiconductor chip, determining a global wiring route be considering a shape of a via in a connecting point between layers and then considering whether a wire grid is unusable by an allocation of said via;

a second step of counting the number of routing tracks to be used in each certain search unit by considering said shape of said via and then considering whether a wire grid is unusable by an allocation of said via; and a third step of determining whether a wiring is possible by verifying a determined result of said global wiring route at said first step and a counted result of said routing tracks at said second step.

4. A method of automatic placement and routing of a semiconductor integrated circuit with a global routing step, said step comprising:

a first step of, based on a placement result in which a functional block included in a library is placed on a semiconductor chip design, determining a global wiring route by considering the number of a plurality of via allocations connecting points between layers and then considering a wire grid is unusable by said via allocations;

a second step of counting the number of routing tracks to be used in each certain search unit by considering the number of said plurality of via allocations and then considering whether a wire grid is unusable by said via allocations; and a third step of determining whether a wiring is possible by verifying a determined result of said global wiring route at said first step and a counted result of said routing tracks to be used at said second step.

5. The method of automatic placement and routing of a semiconductor integrated circuit according to claim 2, wherein the second step assumes either a plurality of via allocations or counts the number of routing tracks to be used by considering a possibility of occurrences of said via allocations.

6. The method of automatic placement and routing of a semiconductor integrated circuit according to claim 4, wherein the second step assumes either a plurality of via allocations or counts the number of routing tracks to be used by considering a possibility of occurrences of said via allocations.

* * * * *